United States Patent [19]

McConchie, Sr.

[11] Patent Number: 4,764,727
[45] Date of Patent: Aug. 16, 1988

[54] CIRCUIT CONTINUITY AND VOLTAGE TESTER

[76] Inventor: Noel P. McConchie, Sr., 6875 Hitchcock Rd., Milford, Mich. 48042

[21] Appl. No.: 918,269

[22] Filed: Oct. 14, 1986

[51] Int. Cl.⁴ .......................................... G01R 31/02
[52] U.S. Cl. .................................. 324/503; 324/524; 324/542; 324/384; 340/52 R; 340/653; 340/660
[58] Field of Search ............... 324/380, 381, 382, 384, 324/503, 508, 522, 523, 524, 538, 539, 541, 542, 555, 556, 402; 340/649, 650, 651, 653, 654, 657, 659, 660, 661, 662, 663, 664, 52 R

[56] References Cited

U.S. PATENT DOCUMENTS

| | | | |
|---|---|---|---|
| 3,317,825 | 5/1967 | Huff | 324/508 |
| 3,378,764 | 4/1968 | Peltz et al. | 324/538 |
| 3,559,200 | 1/1971 | Walters | 340/649 |
| 4,031,461 | 6/1977 | Reiner | 324/556 |
| 4,220,912 | 9/1980 | Williams | 324/503 |
| 4,327,352 | 4/1982 | Cerruti | 340/52 R |
| 4,366,434 | 12/1982 | Ellis | 324/556 |
| 4,385,272 | 5/1983 | Whitehead | 324/542 |
| 4,491,781 | 1/1985 | McClintic | 324/543 |
| 4,542,335 | 9/1985 | Williams | 324/539 |
| 4,547,722 | 10/1985 | Sarlo | 324/504 |
| 4,550,287 | 10/1985 | Babcock | 324/73 R |
| 4,565,963 | 1/1986 | Shaw | 324/503 |
| 4,634,971 | 1/1987 | Johnson et al. | 324/133 |
| 4,689,551 | 8/1987 | Ryan et al. | 324/539 |

OTHER PUBLICATIONS

Motor Magazine, Apr. 1986, pp. 45, 46 and 51-54, Electronic Technicians, by Bob Lund.

Two page advertisement, Concept Technology, Inc., "Test Probe Interface", 1986.
Two page advertisement, Sun Electric Corporation, "Test Link".
Motor Magazine, Mar. 1986, p. 84, "Autodata Model 840 ECM", Microtron Products.

Primary Examiner—A. D. Pellinen
Assistant Examiner—H. L. Williams
Attorney, Agent, or Firm—H. Gibner Lehmann; K. Gibner Lehmann

[57] ABSTRACT

A test module incorporating a unique diagnostic circuit for monitoring the magnitude of electrical parameters existing between an electrical driver such as the electronic control module (ECM) of an automotive vehicle and an electrical load in the vehicle's electrical system. The circuit employs a visual indicator connected to a point adjacent the driver to provide a visual signal when the voltage at the point of connection lies within a predetermined range with respect to electrical ground. An additional visual indicator, separate from the first, is connected to a point adjacent to the electrical load, and provides a visual signal when the voltage at its point of connection lies within a predetermined range with respect to electrical ground. A third visual indicator is connected between the driver and load, and provides a visual signal in response to current flowing between the driver and load. The third visual indicator has a positive temperature coefficient of impedance whereby it presents a relatively low electrical impedance when experiencing relatively low current flow, and exhibits a higher impedance upon experiencing increased current flow.

2 Claims, 4 Drawing Sheets

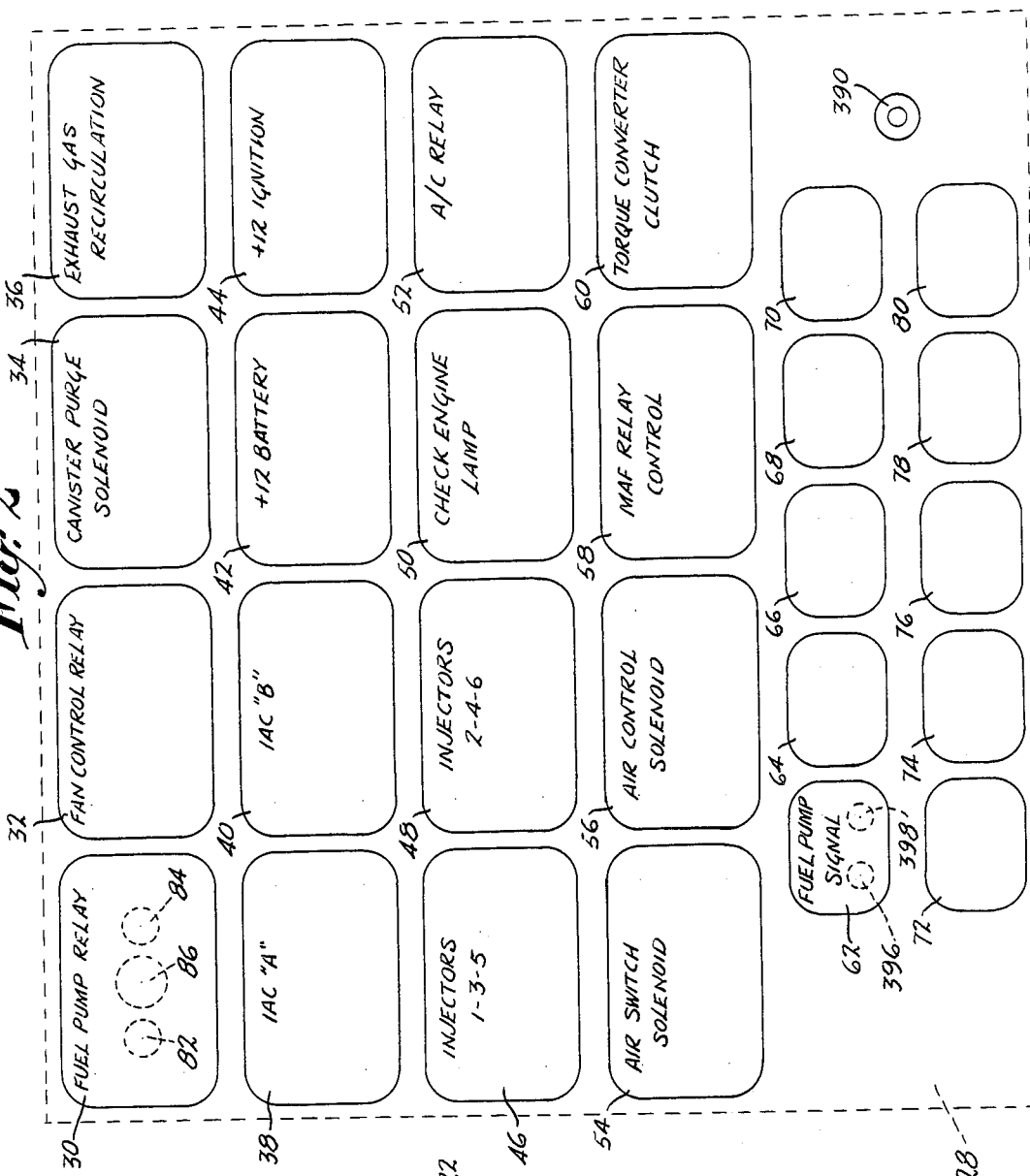

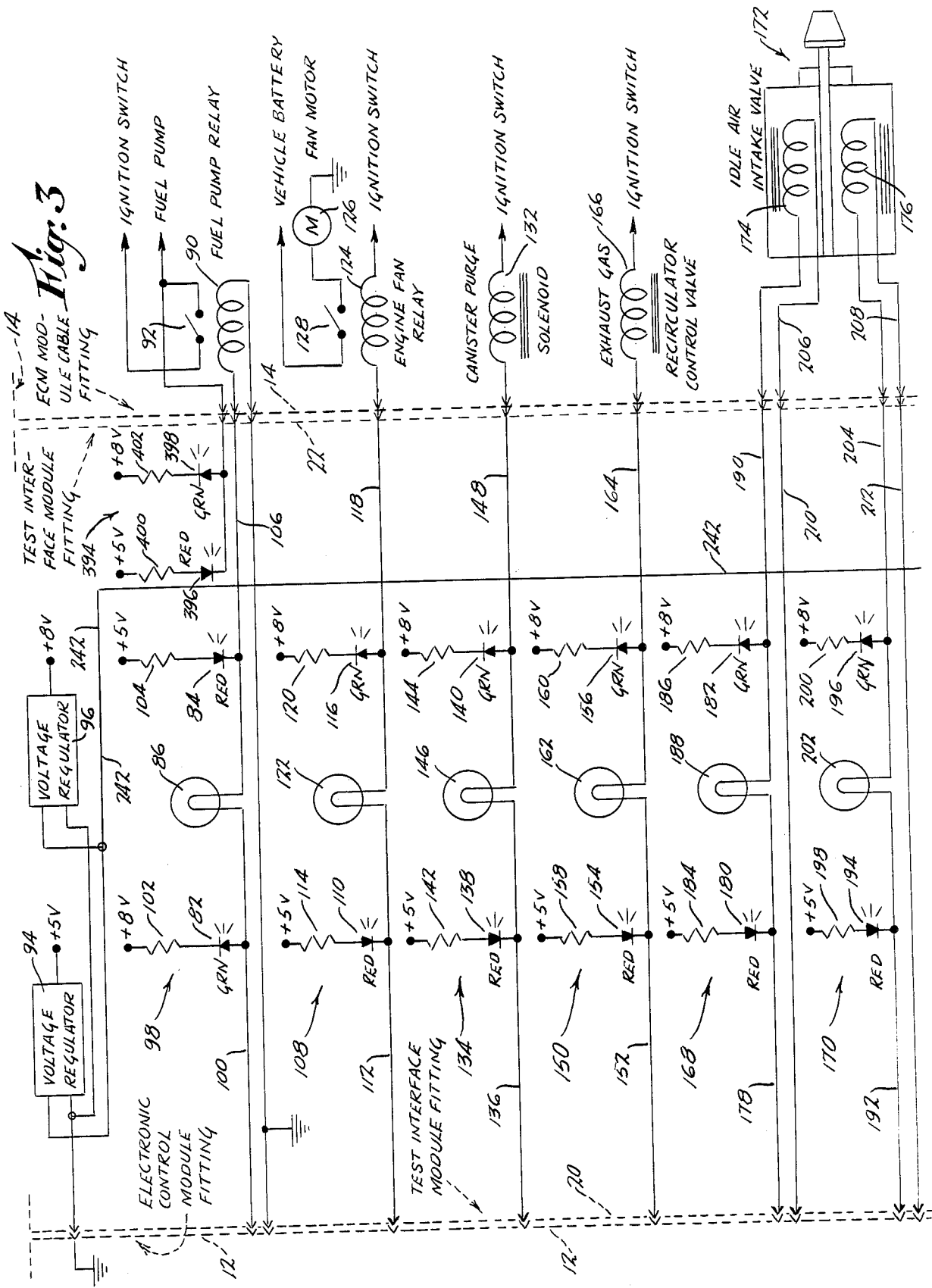

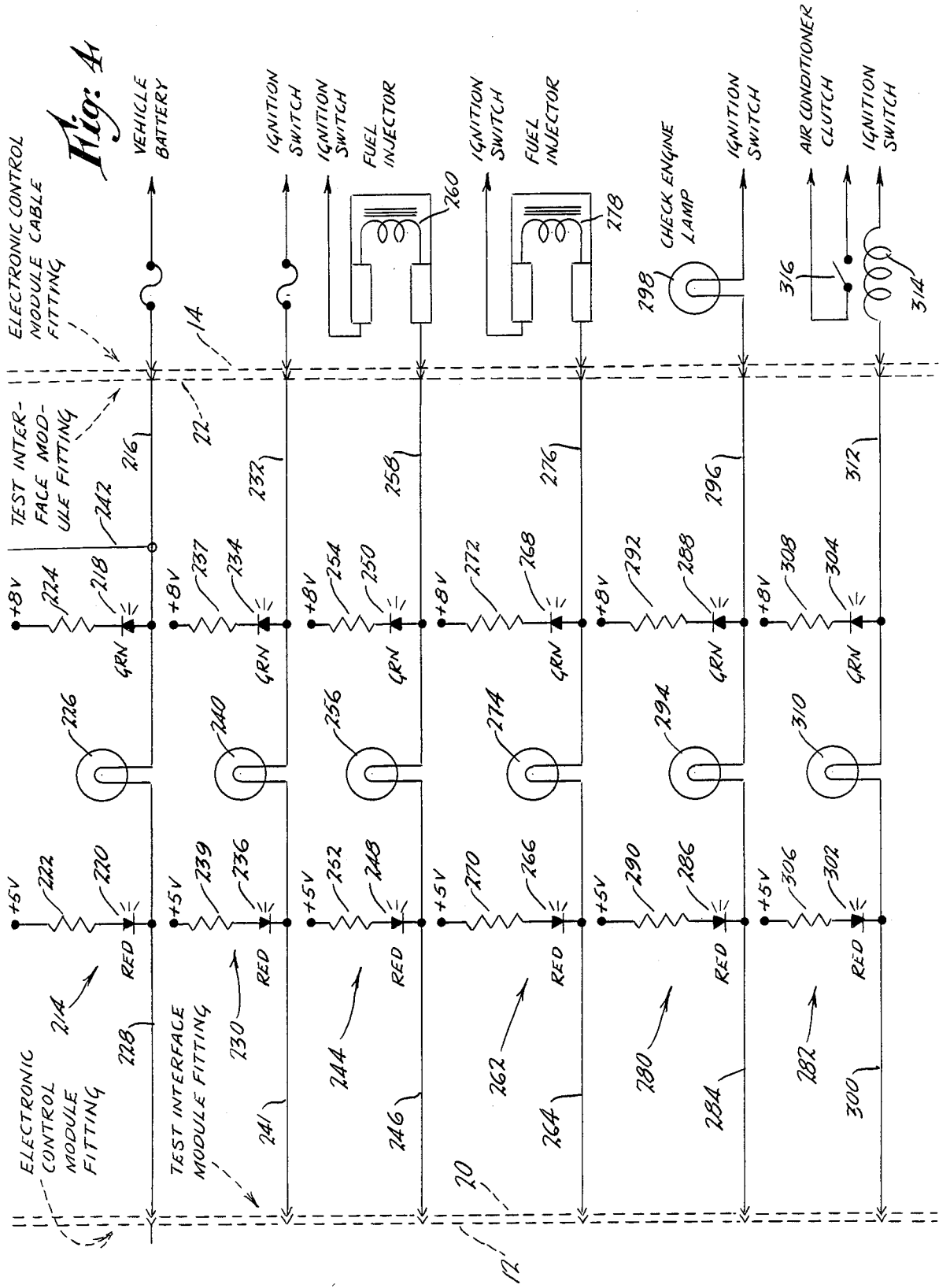

CIRCUIT CONTINUITY AND VOLTAGE TESTER

NO CROSS REFERENCES TO RELATED APPLICATIONS STATEMENT AS TO RIGHTS TO INVENTIONS MADE UNDER FEDERALLY-SPONSORED RESEARCH AND DEVELOPMENT.

Research and development of the present invention and application have not been Federally-sponsored, and no rights are given under any Federal program.

BACKGROUND OF THE INVENTION

1. Field of the Invention

This invention relates generally to test equipment for monitoring and troubleshooting various electrical and electromechanical systems in an automotive vehicle.

2. Description of the Related Art Including Information Disclosed Under 37 CFR §§1.97–1.99

The invention relates more particularly to a unique in-line test module for verifying the presence of proper signal levels generated by an electronic control module (ECM) of a vehicle, as well as for verifying the operativeness of the accessory equipment controlled thereby; in addition, the unique test module provides information relating to the electrical connections existing between the ECM and such equipment, as for example the integrity of the interconnecting wiring harness, connectors associated therewith, etc.

Within the past five years or so, many automobile manufacturers have devised various types of on-board computers that perform a variety of functions ranging from providing control signals that regulate the operation of the vehicle engine and monitor its functioning, to controlling and sensing the operation of various electrical and electromechanical systems of the vehicle. As vehicles became more sophisticated, the on-board computers have been increasingly called upon to perform additional functions, such as those associated with control of anti-pollution equipment, heater or air conditioner devices, and a multitude of other tasks that involve electrical or electromechanical control.

In order to assist service personnel in troubleshooting, many manufacturers have incorporated a diagnostic receptacle connected to the on-board computer, which receptacle can accept a mating receptacle from suitable diagnostic equipment that is specially designed to communicate with the on-board computer. Information is thereby exchanged between the computer and the diagnostic equipment, to isolate areas exhibiting malfunctions or erratic symptoms. Various degrees of sophistication have been employed. One drawback in many of the systems recently devised is that a particular piece of diagnostic equipment may be suitable for use only with selected vehicle models manufactured during a single model year. To the best of my knowledge, up to the present time, little effort has been made to standardize the test equipment or to establish guidelines that would enable such equipment to be universal, and to be capable of employment with vehicles manufactured by different companies, for example.

Typical diagnostic systems currently in use are described in an April, 1986 issue of Motor Magazine, entitled ELECTRONIC TECHNICIANS, pages 45–54. In both of the systems described, a test computer is connected to the automobile's electronic control module (ECM), and the service technician can punch a series of keys to perform checks on a number of the vehicle's operating systems. One arrangement permits the technician to communicate directly with the manufacturer's facility in Detroit. As noted above, one of the problems with such systems is that they are not interchangeable with one another; each manufacturer has devised his own design and the designs are generally limited to use with vehicles made only within the last 3–5 years, and on specific models.

An alternate approach is one adopted by a firm known as Concept Technology, Inc. of Birmingham, Michigan. The apparatus they manufacture is described in an advertising bulletin identified by the number 102-0586, dated 1986. In the disclosed system, a test probe interface module is connected between the vehicle's electronic control module (ECM) and the wiring harness. A "jack box" is provided, having multiple insulated terminals that can be selectively touched by a test probe incorporating a digital readout, with voltage readings from the terminals appearing thereon when the jacks are touched.

Still other systems are illustrated in the April 1986 issue of Motor Magazine. On page 13 is an advertisement for a device manufactured by Thexton Manufacturing Company, of Minneapolis, Minnesota. This system also employs a test probe that is selectively touched to terminals on a matrix board, with readings appearing on a digital meter. The system is also described in an advertising leaflet entitled "How to discover the electronic secrets of Ford's EEC-IV: Introducing Thexton's No. 126 Ford EEC-IV Breakout Box".

Other diagnostic test systems are manufactured by Sun Electric Corporation of Crystal Lake, Illinois and marketed under the name TestLink; by Microtron Products, marketed under the name Autodata Model 840 ECM; and Micro Processor Systems, marketed under the name Analyst 1.

As a result of a patentability search conducted in June of 1986, applicant has become aware of the following issued patents relating to various types of test fixtures and equipment, described herewith.

U.S. Pat. No. 4,220,912 shows a tester circuit that connects to the wiring harness and associated external components of the cruise control circuit for a motor vehicle. Multiple light-emitting diodes are employed, to verify continuity through the wiring harness and various coils associated with the circuit. Also, proper operation of a number of switches can be confirmed. This test circuit is installed in place of the cruise control "computer" module, as opposed to being inserted between a control module and a harness.

U.S. Pat. No. 4,031,461 illustrates a fault detector that can diagnose faulty resistances in a circuit, shorted or open circuits, and other types of malfunctions such as incorrect wiring. This system is of the "single point" type, requiring manually touching a probe tip to various junction points in the circuit.

U.S. Pat. No. 4,366,434 illustrates a combined voltage detector and continuity detector; the operation is briefly explained in column 4, lines 17–32 of the patent specification.

U.S. Pat. No. 4,550,287 illustrates a test instrument employing paralleled light-emitting diodes and series-connected incandescent bulbs. The circuit is intended for use as either a point-to-point continuity checker or a voltage monitor. Selection of the desired function is made by operation of the push button switch.

U.S. Pat. Nos. 4,385,272 and 4,491,781 involve different types of cable testing circuits. U.S. Pat. Nos. 3,559,200 and 3,317,825 describe test modules for three-wire circuits of the type incorporating a hot lead, a neutral lead, and a ground lead.

None of the patented devices identified above is concerned with test modules for use with an automobile's Electronic Control Module (ECM). While the cited patents show a wide range of individual circuits, they would clearly not be useable in their existing form for diagnostic work in connection with a vehicle's ECM and electrical system, and accordingly are considered to be of only passing interest.

It is believed that the main drawback of the automotive diagnostic test systems that have been described is that they tend to be complex in their construction, expensive to manufacture, and difficult to use. More often than not, there is required a good deal of training of the service technician prior to performing any useful troubleshooting work. In addition, while there may be some merit to the concept of hooking up an automobile, via telephone lines, to a central manufacturing facility through the use of a computer, by its very nature a program employing this type of equipment prohibits "road testing" of the vehicle. That is, the vehicle must remain stationary and be physically located in the dealer's service department while any diagnostic tests are being performed and evaluated.

Further, there often exists the possibility of a short-circuit or the occurrence of an overvoltage condition in one of the systems communicating with the ECM; when this occurs, the ECM output circuit may not be capable of sustaining the short or overload, and permanent damage to the unit (ECM) frequently would occur. Under such circumstances, it would have to be discarded completely, and a new, substitute ECM installed. If the location of the short-circuit or overload could not be located, and a substitute ECM is installed, there is the likelihood of the replacement ECM being similarly damaged by the same short-circuit or over voltage condition. As noted above, the recently developed ECM devices are relatively sophisticated, and the expense involved in discarding a unit from inadvertent damage is cost prohibitive.

To the best of my knowledge, attempts to measure current flow between the various terminals of the ECM and the accessory equipment to be controlled were cumbersome, because they usually involved current limiting means, to avoid damage to the ECM. Such limiting means would have to be of the type that did not interfere with the operation of the ECM. It does not appear at present that a satisfactory solution to this problem has been proposed, in terms of maintaining reliable operation without excessive cost or the use of relatively complex circuitry.

Further, it is well established in the electronics field that electrical malfunctions that are of an "intermittent" nature are the most difficult to trace. When one considers the additional variables resulting from vibration, jarring, etc. of a vehicle while it is being driven, coupled with the requirement that during road testing at least two people are needed, one to drive the vehicle, and the other to search for the problem or malfunction, it can be readily appreciated that great difficulty is faced by service personnel in locating and repairing faults whose symptoms appear only during performance of the vehicle under actual driving conditions. To my knowledge, the capability of checking a vehicle during "road testing" has been completely ignored in virtually all of the vehicle diagnostic systems noted above.

Also, while the use of test probes and insulated terminals mounted on matrix boards is satisfactory for laboratory or service station work, it is not at all suitable for road testing, since it generally requires the use of both hands of one of the service technicians while he attempts to simultaneously read a digital voltmeter or equivalent device.

Finally, in many of the known test systems, either the cables are too short to permit a hand-held probe box to be extended into the passenger compartment, or the required vehicle connections do not lend the unit to use while the vehicle is being driven. Road testing is thus impossible.

SUMMARY OF THE INVENTION

The above disadvantages and drawbacks of prior diagnostic test devices for automotive electrical and electromechanical systems are obviated by the present invention, which has for one object the provision of a novel and improved in-line test module which is extremely simple in construction and easy to use.

A related object of the invention is to provide an improved test module of the kind indicated, wherein interpretation of the readings is especially easy and foolproof, thus simplifying the analysis by service technicians using the equipment.

A further object of the invention is to provide an improved test module as outlined above, wherein the nature of a malfunction can be determined extremely rapidly, and without the need for awkward manipulation of test probes, or reading of dials or digital meters.

Yet another object of the invention is to provide an improved test module in accordance with the foregoing, wherein the module can be readily inserted "in-line", between the vehicle's ECM and its wiring harness, and wherein no interference is introduced by the test module, with the result that the accessory equipment being controlled by the ECM receives normal commands therefrom and behaves essentially as if the test module were not present.

Still another object of the invention is to provide an improved test module as above characterized wherein the number of components is reduced to an absolute minimum, thereby simplifying assembly and reducing manufacturing cost.

Yet another object of the invention is to provide an improved test module as above set forth, wherein the module is especially suited for use in "road testing" of a vehicle, and wherein the visual indicators employed are easily viewed by service personnel.

A still further object of the invention is to provide an improved test module in accordance with the foregoing, wherein the unit has built-in protective circuitry for the vehicle's ECM against inadvertent damage arising from short-circuits, over-voltages, or open-circuits in the vehicle equipment or wiring harness associated therewith.

A further object of the invention is to provide an improved test module as outlined above, wherein self-diagnostic circuitry contained therein provides an indication to service personnel using the equipment that a malfunction may possibly have occurred in the test module itself.

Still another object of the invention is to provide an improved test module of the kind indicated, which is powered solely from the vehicle's electrical system, whereby the module can be portable and accompany the vehicle for performing diagnostic checks thereon during "road testing".

The above objects are accomplished by a test module incorporating a unique diagnostic circuit for monitoring the magnitude of electrical parameters existing between an electrical driver such as an ECM and an electrical load, comprising in combination a visual indicator means connected to a point adjacent the driver, the indicator means providing a visual signal when the voltage at the point of connection lies within a predetermined range with respect to electrical ground, additional visual indicator means, separate from the first, connected to a point adjacent to the load, the additional indicator means providing a visual signal when the voltage at its point of connection lies within a predetermined range with respect to electrical ground, and a third visual indicator means, connected between the driver and load, the third indicator means providing a visual signal in response to current flowing between the driver and load. The third visual indicator means has a positive temperature coefficient of impedance whereby it presents a relatively low electrical impedance when experiencing relatively low current flow, and a higher impedance upon experiencing increased current flow. The impedance is initially so low as to not interfere with energization of the load, typically a solenoid or a relay coil, but increases somewhat in a very short time interval. The increased impedance is not sufficient to result in de-energization of the load, and the indicator provides a rough visual reading of current flowing from the ECM to the load, as will be explained in more detail below.

The objects are further accomplished by a diagnostic inline test module for connection to an input/output multi-terminal electrical fitting of an electronic control module (ECM) of an automotive vehicle and the mating multi-terminal electrical fitting that is carried by a wiring harness of the vehicle, which test module comprises in combination, a plurality of separate and distinct networks, each network having an input and an output, a pair of electrical fittings to mate with the multi-terminal electrical fitting of the control module and with the mating multi-terminal electrical fitting carried by the wiring harness, the input of one of said networks being connected to at least one terminal of the electrical fitting that mates with the multi-terminal electrical fitting of the control module, and the output of the said one network being connected to a corresponding terminal of the electrical fitting which mates with the multi-terminal electrical fitting carried by the wiring harness. The one network comprises visual indicator means connected at its input, which means provides a visual signal when the voltage at the network input lies within a predetermined range with respect to electrical ground. The one network further comprises an additional visual indicator means, separate from the first, connected at its output, the additional indicator means providing a visual signal when the voltage at the network output lies within a predetermined range with respect to electrical ground, and a third visual indicator means, connected between the network input and output. The third indicator means responds to current flowing through the network. It has a positive temperature coefficient of impedance whereby it presents a relatively low electrical impedance when experiencing relatively low current flow, and a higher impedance upon experiencing increased current flow.

Other features and advantages will hereinafter appear.

BRIEF DESCRIPTION OF THE DRAWINGS

FIG. 1 is a diagrammatic representation of the electronic control module (ECM) of an automotive vehicle, and illustrating the improved in-line test module of the present invention connected between the multi-terminal electrical fitting of the ECM and a multi-terminal electrical fitting that extends to the vehicle's wiring harness.

FIG. 2 is a top plan view of a read-out panel of the test module, illustrating a series of transparent, coded windows, behind which are located a series of visual indicator devices that provide readings of electrical parameters associated with the vehicle's engine and its electrical and electromechanical systems, and readings of electrical parameters associated with other systems of the vehicle.

FIGS. 3-5, taken together, illustrate a schematic circuit diagram of the test module of the present invention, particularly showing mating electrical fittings on the vehicle's ECM and the test module, and mating electrical fittings on the test module and the vehicle's wiring harness.

DESCRIPTION OF THE PREFERRED EMBODIMENT

Figure 5:
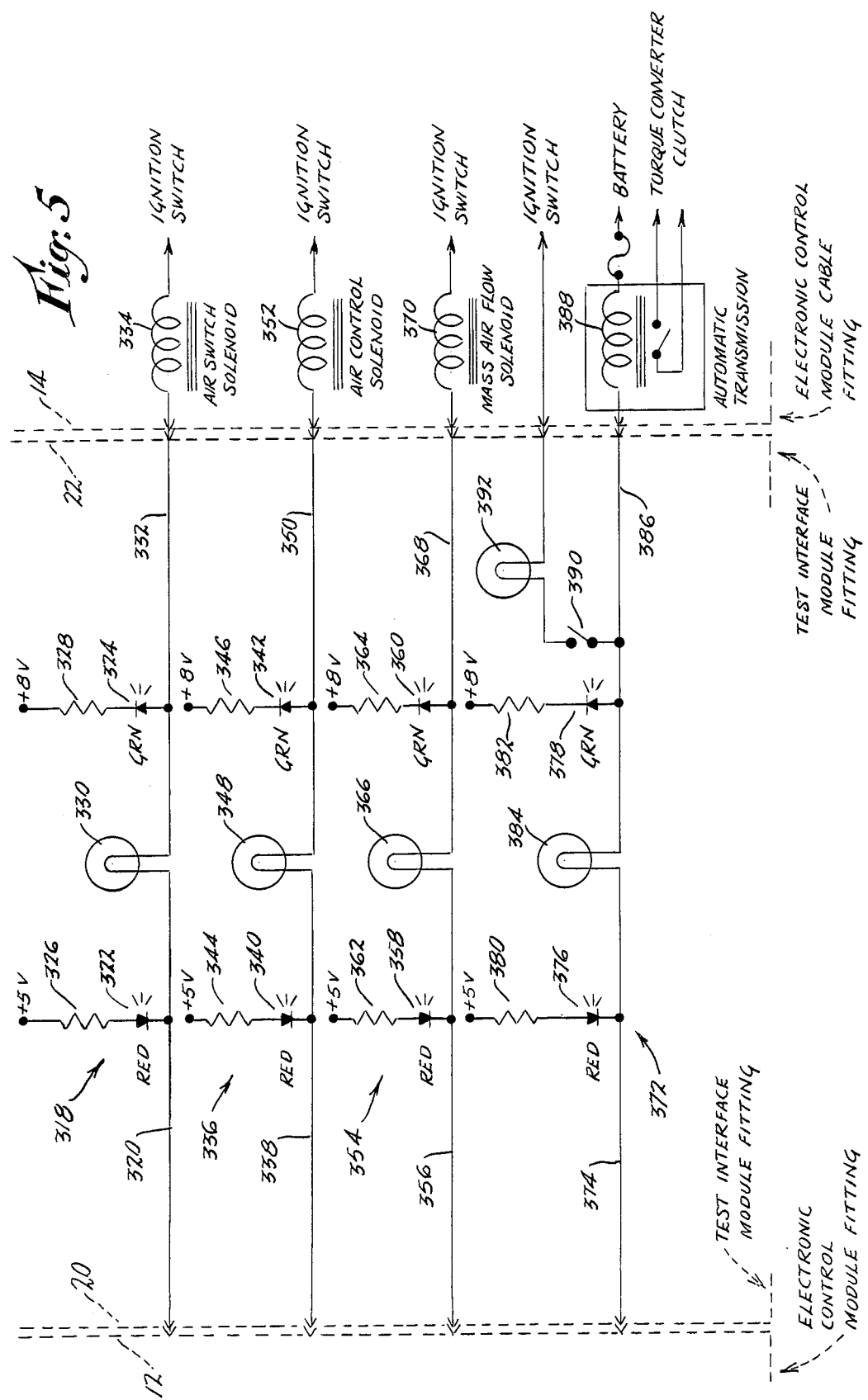

FIG. 1 illustrates the electronic control module (ECM) 10 of an automotive vehicle, having a multi-terminal electrical fitting 12 intended to be connected to a mating multi-terminal electrical fitting 14 extending to the vehicle's electrical wiring harness 16.

In accordance with the present invention there is provided a novel and improved in-line interface test module 18 for connection between the ECM 10 and the wiring harness 16, for monitoring various electrical or electromechanical parameters associated with the vehicle's electrical system, engine, and accessories. The novel test module has multi-terminal electrical fittings 20, 22 that are complementary to those on the ECM and wiring harness, such that in connecting the test module 18 to the vehicle, the wiring harness fitting 14 is merely removed from the ECM fitting 12, and one fitting 20 of the test module 18 connected to the ECM fitting 12, and the other fitting 22 of the test module 18 connected to the fitting 14 of the wiring harness 16, as in FIG. 1. The module 18 preferably has electrical cabling 24, 26 extending to the fittings 20, 22 such that the module can be located at a convenient position in the vehicle passenger compartment while the vehicle is being driven, to facilitate "road testing". The cabling 24, 26 can be typically 8 or 10 feet or more in length, as dictated by the physical size of the vehicle.

FIGS. 1 and 2 illustrate an indicator or read-out panel 28 of the test module 18, having a series of transparent or semi-transparent windows 30, 32, 34, 36, 38, 40, 42, 44, 46, 48, 50, 52, 54, 56, 58, 60, 62, 64, 66, 68, 70, 72, 74, 76, 78 and 80 which are intended to be identified or coded, to indicate the particular system or vehicle parameter associated with that window. Twenty-six windows are illustrated, sixteen being disposed in four rows of four each, and ten being disposed in two rows of five windows each. Each of the 16 large windows 30-60 preferably has three visual indicator devices behind it. The indicators behind window 30 are designated 82, 84 and 86, and are selectively illuminated in various combinations to provide data to service personnel, relating to the value of the parameter or condition of the system being monitored.

For example, the first window in FIG. 2, "FUEL PUMP RELAY", provides information relating to signals transmitted to the fuel pump relay coil 90 (FIG. 3), from the ECM 10 (or ECM driver as it is sometimes referred to). The contacts of the fuel pump relay are indicated 92. From an inspection of the three visual indicators 82, 84 and 86, service personnel can confirm proper operation of the circuit, or be alerted to possible malfunctions in the system. There is thus made available information relating to the condition of the relay coil 90, the electrical connections thereto, the integrity of the wiring harness and electrical fittings, the ECM, as well as other conditions involving this system. The windows 30-80 are preferably "frosted" for aesthetic purposes, so that the actual indicator devices 82, 84 and 86 are not directly visible, but light therefrom is, and can readily pass through and be easily seen by a service technician.

Referring to FIGS. 2 and 3, and in accordance with the present invention, the three visual indicators 82, 84 and 86 take the form of two light-emitting diodes 82, 84 and an incandescent lamp 86. The lamp 86 is shown in dotted outline in the window labelled "FUEL PUMP RELAY", and is disposed between the two light-emitting diodes 82, 84, also shown in dotted outline. One of the light-emitting diodes 84 is selected to be of a type that emits one color such as red, whereas the other light-emitting diode 82 is selected to emit a different color such as green. Other color schemes are possible, as long as a distinction can be made between illumination of the incandescent lamp 86, and illumination of each one of the light-emitting diodes 82 and 84.

By the invention, the test module 18 comprises a series of networks similar to that containing the visual indicators 82, 84 and 86, the networks being connected between corresponding terminals of the two multi-terminal electrical fittings 20 and 22 of the test module 18, as in FIGS. 1 and 3-5. Also, the test module 18 comprises two voltage sources, shown as supplying +5 and +8 volts d.c. The ECM is supplied by the vehicle's battery/alternator with +12 volts d.c. and the +5 volt and +8 volt sources comprise a pair of voltage regulators 94, 96 respectively that accept +12 volts from the ECM and provide regulated outputs that are used with the light-emitting diodes, as will be explained below.

Further, referring to FIG. 3 and by the invention one network comprising the indicators 82, 84 and 86 is in the form of a pi-network. It is designated 98, and the light-emitting diode 82 has an electrical point of connection to an input line 100 extending to a terminal of the test module electrical fitting 20, and having a second point of connection to a current limiting resistor 102 extending to the output of the regulator that supplies +8 volts. Thus, In FIGS. 2-4, the terminal points designated "+5 v" are connected to the output of the regulator 94 whereas those designated "+8 v" are connected to the regulator 96. Thus, the light-emitting diode 82 provides a visual indication, by becoming illuminated, when the voltage at its anode (input line 100 of network 98) exceeds +8 volts d.c. by about 2 volts, i. e. when the voltage is above +10 volts d.c.

Further, by the invention the additional visual indicator comprising the second light-emitting diode 84 has an electrical point of connection to a terminal of the other test module electrical fitting 22, and a second point of connection to a current limiting resistor 104 extending to the output of the regulator 94 that supplies +5 volts d.c. Accordingly, the light-emitting diode 84 provides a visual indication, by becoming illuminated, when the voltage at its cathode becomes less than +5 volts by about 2 volts, i.e. when the voltage is less than +3 volts d.c. The output line of network 98 is indicated 106. Finally, the third visual indicator comprising lamp 86 provides a visual signal in response to current flowing therethrough. Preferably this third indicator has a positive temperature coefficient of resistance or impedance, and I have discovered that an incandescent bulb or lamp is extremely well suited for use in this application. Typically the resistance of the lamp when cold is several ohms, and it increases with temperature, as the lamp glows more brightly, to 10 ohms or more at full brilliance. The exact values depend upon the rating of the lamp, as will be explained further, below. In general, however, by the invention the series incandescent lamp does not interfere with energization of the load, since its cold resistance is relatively low as compared with that of the load.

By the above arrangement, three separate and distinct sources of information are made available from the network 98. A relatively simple on-off signal is produced by each of the light-emitting diodes 82 and 84, advising the service technician of the range of voltage adjacent the ECM output (line 100) and adjacent the load (line 106 which is connected to the fuel pump relay coil 90). In addition, a separate indication is provided by the incandescent lamp 86, whose illumination increases non-linearly with increases in current therethrough. Accordingly a rough indication of the current flowing from the ECM terminal through line 100 to the fuel pump relay coil 90 can be determined by observing the illumination of the incandescent lamp 86. Also, the two light-emitting diodes 84 and 86 provide an indication of the range of voltage appearing at lines 100 and 106, as can be readily understood.

For purposes of explanation, reference is now made to the Appendix, item #1, "FUEL PUMP RELAY", which illustrates a diagnostic chart that indicates the particular combination of responses corresponding to normal operation of the ECM and fuel pump relay circuit, as well as indicating areas of possible problems therein.

For example, readings for two types of vehicle operating modes are provided, one being that with the vehicle ignition (key) "on" and the vehicle engine off; and the other being that with the vehicle engine running.

In the chart, an "0" indicates that the corresponding light-emitting diode or incandescent lamp is not illuminated; a "1" indicates that a particular light-emitting diode or the lamp is illuminated. "(1)" indicates a bright condition of the incandescent lamp, whereas, [1] indicates a dim condition thereof.

In the present instance, the fuel pump is rendered operative in response to a high digital level (near +12 volts d.c.) applied by the ECM to the terminals of the fittings 12 and 20 corresponding to line 100 of network 98. In many vehicles, a temporary priming of the fuel line occurs when the ignition key is initially turned on, and the priming interval is typically 2 seconds. Following such priming, a timer in the ECM cuts off drive to the pump relay coil 90 until cranking of the engine commences.

In the following discussion it is assumed that light-emitting diode 84 emits red light, light-emitting diode 82 emits green light, and the incandescent lamp or bulb emits essentially white light. When the ignition key is initially turned "on", the ECM applies +12 volts to line 100 for 2 seconds or so; the red light-emitting diode 84 is off, the green light-emitting diode 82 is on, and the incandescent lamp 86 is momentarily illuminated. As noted above, the initial resistance of the lamp is low compared to that of the relay coil, so that the coil receives sufficient drive to operate contacts 92. Even though the lamp glows and its resistance increases somewhat, the value of the resistance does not reach a point where the relay coil 90 would become de-energized sufficiently to release the contacts 92.

After two seconds has elapsed, the ECM output on line 100 drops to zero volts, as a consequence of the timer in the ECM which is associated with the initial 2 second priming of the fuel lines, as noted above. The red light-emitting diode 84 comes on, the green light-emitting diode 82 goes off, and the lamp 86 goes out because current flow to the relay coil 90 has stopped.

After the engine is started, the ECM output (applied to line 100) would be high, near +12 volts d.c. and normal functioning would correspond to the red light-emitting diode 84 being out, the green light-emitting diode 82 being on, and the incandescent lamp 86 being illuminated. This would indicate that the output line 106 of the network 98 is sufficiently high in voltage to maintain energization of the relay coil 90, and that the coil is indeed drawing current.

Referring again to item #1 of the Appendix, namely first listed fault, indicated "X" in the "Fault Detected" box, if the relay coil 90 were either open-circuited or the ground connection to the coil 90 were missing, no current would flow through the lamp 86. The red light-emitting diode 84 would be out, the green light-emitting diode 82 would be on, and the incandescent lamp 86 would be out.

On the other hand, if the coil 90 or that part of the harness 16 involving the coil 90 were short-circuited to ground, then both light-emitting diodes 82 and 84 would be on, and the lamp 86 would glow brightly since it would have across it a voltage probably near or in excess of its rating, 6.3 volts.

If a condition existed where there was no output from the ECM (referred to in the chart as an ECM driver), or if the ECM line controlling the fuel pump relay coil were short-circuited to ground, then the red light-emitting diode 84 would be on, the green light-emitting diode 82 would be off, and the lamp 86 would be off. Again, this condition constitutes a fault, and is indicated by an "X" in the "Fault Detected" column.

Further, if the lamp 86 were to be burned out (or its filament broken from vibration), both light-emitting diodes 82 and 84 would be on. The test module 18 thus is inherently self-diagnostic. If it provides erroneous readings, the symptoms usually point to a particular area, even if the test module itself is at fault.

Finally, if none of the indicators 82, 84 or 86 is on, then either the ECM is not supplying output voltage, or the coil 90 is not connected in the circuit, as a load.

The fuel pump relay circuit is of a type known as an "up driver", since the relay coil is energized in response to the ECM output switching from a low digital voltage (near ground) to a high digital voltage (near +12 volts).

Most of the remaining circuits associated with the ECM are what are known as "down drivers" wherein the particular load, typically a relay coil or a solenoid, has one lead permanently connected to +12 volts, either through a direct tie to a positive bus (fused battery line) in the vehicle, or to the vehicle's ignition switch.

Referring again to FIG. 3 and in accordance with the invention there is provided an additional network 108, separate from the first network 98, the additional network comprising a first visual indicator means comprising a light-emitting diode 110 having an electrical point of connection to the network input line 112 extending to a terminal of the test module electrical fitting 20, and having a second point of connection to a current limiting resistor 114 extending to the output of the regulator 94 that supplies +5 volts. Thus, the light-emitting diode 110 provides a visual indication, by becoming illuminated, when the voltage at its cathode becomes less than +5 volts, by about 2 volts, i.e. when the voltage is less than +3 volts d.c.

Further, by the invention there is provided an additional visual indicator means comprising a second light-emitting diode 116 having an electrical point of connection to the network output line 118 that extends to a terminal of the other electrical fitting 22 of the test module, and having a second point of connection to a current limiting resistor 120 extending to the output of the regulator 96 that supplies +8 volts d.c. Accordingly, the light-emitting diode 116 provides a visual indication, by becoming illuminated, when the voltage at its anode exceeds +8 volts d.c. by about 2 volts, i.e. when the voltage is above +10 volts d.c. Finally, the invention embraces a third visual indicator means comprising an in-line indicator or incandescent lamp 122 of relatively low impedance, which responds to current flowing through the network 108. As in the case of the first network 98, the lamp 122 has a positive temperature coefficient of resistance or impedance. Typically this lamp has a voltage rating of 6.3 volts, as in the previous case.

The second network 108 is intended to monitor the signals originating at the ECM, which control a relay associated with the vehicle's radiator fan 126. The relay coil is designated 124 and the contacts indicated at 128. In many recent model vehicles, the radiator fan is electrically powered as opposed to being mechanically driven by the engine as in almost all older model vehicles. Power to the electric fan 126 is controlled by the contacts 128.

Mounted behind the window 32 designated "FAN CONTROL RELAY" in FIG. 2 are the two light-emitting diodes 110 and 116, one red and one green, and the incandescent lamp 122. These are shown in FIG. 3, but have been omitted from FIG. 2 for clarity. Again, preferably the window 32 is frosted so that these components are not directly visible, but the light emitted therefrom is.

In operation, in order to energize the relay coil 124, the ECM "sinks" current supplied from the ignition circuit through the coil. That is, when the output of the ECM is high (near +12 volts), the coil 124 has approximately the same voltage applied to both sides of it and is thus unenergized. When the output of the ECM switches to a low state, near ground, current flows from the ignition circuit through the coil 124, and into the ECM, such that the coil 124 becomes energized.

Reference is again made to the Appendix, item #2, "FAN CONTROL RELAY", which shows another diagnostic chart that indicates the particular combination of responses corresponding to normal operation of the ECM and fan control relay circuit, and pinpoints areas of possible problems therein.

For example, readings for two types of vehicle operating modes are provided, one being that with the vehicle ignition (key) "on" and the vehicle engine off; and the other being that with the vehicle engine running. Under the first mode of operation, a normal condition would be indicated when the red light-emitting diode 110 is off, the green light-emitting diode 116 is on, and the incandescent lamp 122 is off.

If the red light-emitting diode were on, with the green light-emitting diode off and the incandescent lamp on, this would indicate the existence of a faulty ECM output, possibly a short-circuit to ground. The fault condition is indicated in the "Fault Detected" column by the presence of an "X".

If the red light-emitting diode 110 is on, and both the green light-emitting diode 116 and lamp 122 are off, a fault in the nature of a short-circuit to ground in part of the wiring harness is suspected. If all three indicators are off, either the relay coil 124 or part of the wiring harness is probably open-circuited.

In the "engine run" mode, normal operation corresponds to the red light-emitting diode 110 being on, the green light-emitting diode 116 being off, and the lamp 122 being on. Coolant temperature in excess of 230° F. would be indicated, because the circuit is usually designed so that the electric fan only operates at relatively high engine coolant temperatures. If the red light-emitting diode 110 is on while the green light-emitting diode 116 and lamp 122 were to go off, either the wiring harness or the coil 124 would probably be open-circuited, or there would appear to be no voltage from the ignition circuit being applied to the coil 124.

If both light-emitting diodes 110 and 116 are on and the lamp 122 is off, a faulty lamp (either burned out or broken filament) would be suspected.

Additional networks are employed in the test module 18 for monitoring the operation of other systems of the vehicle. The network 134 monitors the functioning of the "CANISTER PURGE SOLENOID", which solenoid is designated 132; this solenoid controls a valve that regulates vacuum in a vapor line (not shown) which extends between the engine's intake manifold and a charcoal-filled fuel vapor recovery canister that collects and adsorbs fuel vapors from the vehicle's fuel tank. Improper operation of the valve can result in continuous release to the intake manifold, of fuel vapor stored in the canister. As a consequence, fuel can enter the manifold at idle or during warm-up, which can cause rough or unstable idle, or overly rich (fuel mixture) operation during warm-up.

The network 134 has an input line 136 extending to one terminal of the fitting 20, light-emitting diodes 138 and 140, resistors 142 and 144, and incandescent lamp 146. The network output line 148 extends to one terminal of the fitting 22, and drives the solenoid 132, constituting the load. In the Appendix, item #3 illustrates the diagnostic chart associated with operation of the canister purge solenoid 132. Light-emitting diode 138 is assumed to emit red light whereas light-emitting diode 140 emits green light.

Another network of the test module 18 is employed to monitor what is known as the Exhaust Gas Recirculator (EGR). This system is designed to divert a small portion of the exhaust gas and channel it to the intake manifold of the engine. An EGR valve controls the flow rate. The valve can be either a simple on/off unit, or one of a type intended to be modulated by the ECM, usually with a square wave. The system decreases combustion temperature and thereby reduces "knock"; in effect it retards combustion.

The EGR monitoring network is designated 150, having an input line 152, light-emitting diodes 154 and 156, current limiting resistors 158 and 160, and a series incandescent lamp 162. The network output line 164 is connected through fittings 22, 14 to the coil 166. As in the case of the canister purge solenoid 132 and the engine fan relay coil 124, one side of the load (coil 166) is connected to the ignition circuit, and receives +12 volts when the ignition switch is on.

In the Appendix, item #4 illustrates a diagnostic chart that indicates the conditions of the light-emitting diodes 154 and 156 and lamp 162 corresponding to normal operation, as well as conditions thereof corresponding to various types of malfunctions in the system or in the test module.

Two additional networks 168 and 170 are employed in the test module 18 for monitoring operation of what is known as the "idle air intake (IAC) valve". This valve 172 controls engine idle speed by regulating the amount of air intake to either the carburetor, or to the intake manifold in the case of fuel injected engines. In the disclosed embodiment two separate coils 174 and 176 are employed to enable the valve 172 to have a stepping characteristic. Both sides of each coil 174 and 176 normally connect to the ECM, since in operation the ECM reverses the direction of current flow and thus adjusts the opening and closing of the valve 172.

The network 168 has an input line 178, light-emitting diodes 180 and 182, resistors 184 and 186, and incandescent lamp 188. This network has an output line 190, and monitors energization of the coil 174. The network 170 similarly monitors energization of the coil 176. Network 170 has an input line 192, light-emitting diodes 194 and 196, series resistors 198 and 200, incandescent lamp 202, and output line 204. The voltage ratings of the lamps 188 and 202 is typically 12.6 volts.

The return leads of the coils 174, 176 respectively are directly connected through lines 210 and 212 to terminals of the ECM, as shown. Item #5 of the Appendix illustrates the diagnostic chart for determining proper operation of the circuitry associated with the idle air intake valve 172.

Referring now to FIG. 4, the test module 18 further includes an additional network 214 for monitoring voltage that is supplied to the ECM 10 from the vehicle battery/alternator, and the current drawn through the line by the ECM 10. The network has an input line 216, and light-emitting diodes 218 and 220, resistors 222 and 224, and incandescent lamp 226. The output line is designated 228. Similarly, another network 230 having an input line 232, light-emitting diodes 234 and 236, resistors 237 and 239, and incandescent lamp 240 is arranged to monitor the presence of +12 volts from the ignition circuit which is also applied through output line 241 to the ECM, and the current supplied to the ECM from this ignition line. The voltage rating of the lamps 226 and 240 is typically 12.6.

In the Appendix, items #6 and #7 illustrate the corresponding diagnostic charts. It is noted that in the case of the latter two networks 214 and 230, the ECM 10 represents a load, and the battery and ignition leads constitute two separate power supplies. The battery network provides constant +12 volts to the ECM, whereas the ignition line normally supplies +12 volts to the ECM only when the ignition switch is on. Power to the regulators 94, 96 flows from line 216 through a line 242, FIGS. 3 and 4. It is noted that the test module of the invention is supplied with power derived entirely from the vehicle; no connections to 115 volt commercial power mains are required. Nor are connections to external equipment involved, as in the case of large test stands of a type typically mounted on fixed panels or racks and permanently located in a service station or dealership service area. In contrast, the present test module is completely portable and thus is well suited for use in "road testing" of a vehicle.

Further, in FIG. 4, two additional networks in the test module monitor operation of the engine's fuel injectors. On a six cylinder vehicle of the type incorporating what is known as throttle body injection (TBI), one solenoid is employed to control three of the fuel injection valves, one valve for each of three cylinders. A second solenoid controls the remaining three fuel injection valves, again, one valve for each cylinder. In vehicles employing port fuel injection (PFI), a separate solenoid is employed with each valve. Accordingly, on a six cylinder vehicle, six coils would be required, one for each fuel injection valve.

Considering a vehicle incorporating throttle body fuel injection (TBI), one network 244 of the test module 18 has an input line 246, light-emitting diodes 248 and 250, resistors 252 and 254, and lamp 256. The network output line 258 is connected to the coil 260 controlling three fuel injector valves (not shown), for example, those associated with cylinders Nos. 1, 3 and 5 of the engine; the other network 262 has an input line 264, light-emitting diodes 266 and 268, resistors 270 and 272, and lamp 274. The output line 276 is connected to the coil 278 controlling the other three injectors, associated with cylinders Nos. 2, 4 and 6. In the Appendix, item #8 illustrates the diagnostic chart for networks 244 and 262. The voltage ratings for lamps 256 and 274 is typically 12.6.

In FIG. 4 two additional networks 280 and 282 are illustrated. Network 280 has an input line 284, light-emitting diodes 286 and 288, resistors 290 and 292, and incandescent lamp 294. The network output is designated 296. The network 280 is arranged to monitor operation of the dashboard panel light known as the "CHECK ENGINE LAMP", the lamp being indicated 298. This lamp is a warning light indicating a possible malfunction of a number of systems, for example, improper operation of the EGR system, or malfunctions in the carburetor mixture control solenoid. Also, this lamp 298 would become illuminated if there occurred a loss of the tachometer signal, or if improper oxygen sensor (O2 sensor) operation was sensed.

The other network 282 has an input line 300, light-emitting diodes 302 and 304, resistors 306 and 308, and lamp 310. The output line 312 is connected to a relay coil 314 associated with the air conditioner system. In particular, there is a clutch (not shown) interposed between the engine and the air conditioner compressor; the clutch is controlled by the relay contacts 316. When the clutch is disengaged, the compressor shaft is free turning. Energization of the clutch couples the engine to the compressor shaft, for initiating operation thereof when cooling is called for. Items #9 and #10 in the Appendix illustrate the diagnostic charts associated with these two systems, namely the "CHECK ENGINE LAMP" circuit, and the air conditioner circuit. The voltage ratings of lamps 294 and 310 are typically 6.3 volts.

Referring now to FIG. 5, additional networks are employed in the test module 18, for monitoring other systems. The network 318 has an input line 320, light-emitting diodes 322 and 324, resistors 326 and 328, and incandescent lamp 330. It has an output line 332, and is intended to verify proper operation of what is known as the "air switch solenoid". This solenoid 334 controls a valve (not shown) that channels regulated amounts of air (containing oxygen) to the vehicle's catalytic converter; without the introduction of oxygen to the catalytic converter, it would not function properly.

An additional network 336 having an input line 338 includes light-emitting diodes 340 and 342, resistors 344 and 346, and incandescent lamp 348. The network has an output line 350. The circuit is arranged to confirm operation of what is known as the "air control solenoid". This solenoid 352 in turn regulates a valve that introduces air (containing oxygen) to the exhaust manifold, which facilitates further reaction of unburned hydrocarbons therein when the vehicle is initially started. In the absence of such a system, unburned fuel would be emitted into the atmosphere.

A third network in FIG. 5 is designated 354. It has an input line 356, light-emitting diodes 358 and 360, resistors 362 and 364, and incandescent lamp 366. Its output line is indicated 368. The network monitors operation of the "mass air flow" solenoid 370, which regulates a valve (not shown) that controls the amount of air being drawn into the engine's intake manifold. A reading of the number of cubic feet per minute of air flow is determined, and the appropriate quantity of fuel is introduced in order to achieve a desired air/fuel ratio, this ratio typically being 14.7.

Another network is designated 372, having an input line 374, light-emitting diodes 376 and 378, resistors 380 and 382, and incandescent lamp 384. Its output line is indicated at 386. The circuit is arranged to check the operation of the torque converter clutch (TCC) 388. The network is modified slightly. It includes a push button test switch 390 shown in both FIGS. 2 and 5, and an additional incandescent lamp 392. The additional switch 390 and lamp 392 are required to test the ECM output that connects with line 374. Under certain circumstances and in selected vehicles, a pressure-responsive switch (not shown) disconnects the coil 388 from the vehicle battery. Thus no voltage is applied to the coil 388. The additional lamp 392 is connected to the ignition switch, receiving +12 volts on one lead. It thus constitutes a temporary load, and when the ECM output switches to a low state, its ability to "sink" current flowing through this additional lamp is confirmed. If it is unable to "sink" sufficient current to illuminate the lamp 392, a problem with the ECM may be indicated. In the Appendix, items #11-14 illustrate the corresponding diagnostic charts for the respective systems of FIG. 5.

Further, in accordance with the invention and referring to FIG. 3, there is illustrated a somewhat modified network 394 similar to those already described, except that the series incandescent lamp has been eliminated. In an actual test module, 10 or more circuits similar to that designated 394 would be employed; only one is being shown for purposes of simplicity.

The modified network 394 is arranged to monitor the voltage existing at a predetermined point in the vehicle's electrical system. In the disclosed circuit, two light-emitting diodes 396 and 398 are incorporated in the network, having series resistors 400 and 402, with the resistors in turn extending to the sources of constant voltage from the regulators 94 and 96, +5 volts and +8 volts respectively. The light-emitting diodes 396 and 398 have the relative polarities shown. In operation, when the fuel pump relay coil 90 is energized and the contacts 92 of the relay close, +12 volts will be applied to the fuel pump itself, and simultaneously to the common point of connection of the light-emitting diodes 396 and 398. Because diode 398 is forward biased and diode 396 is reverse biased, the one will become illuminated, and the other will be off. When the relay coil 90 is de-energized, the fuel pump does not receive voltage; instead it merely constitutes a relatively low impedance load connected from the common junction point of the light-emitting diodes to ground. Accordingly the light-emitting diode 396 will become illuminated, and the light-emitting diode 398 will be off. This modified network thus supplies additional diagnostic information, which, when coupled with that provided by the network 98 associated with monitoring of the coil 90 of the fuel pump relay, facilitates system testing by service personnel.

For example, if the coil 90 of the fuel pump relay is functioning properly as indicated by the network 98, but the light-emitting diodes 396 and 398 of the modified network 394 do not alternate with successive energization and de-energization of the coil, a problem can be considered to exist in either the wiring extending to the fuel pump, or in the fuel pump itself. (The pump may have an open-circuit, or a short-circuit). A diagnostic chart for the modified network is provided in the Appendix, item #15.

Other points in the vehicle's electrical system can be monitored with the modified network 394 shown in FIG. 3. In particular, where appropriate, single lead connections can be incorporated in the test module and extend, for example, to operating systems involving the vehicle's 4th gear switch, air conditioner clutch, electronic spark timing (advance), EGR vacuum control signal, vehicle speed sensor, park/neutral switch, air conditioner fan, power steering switch, or other systems. Only one network 394 has been illustrated in the present application, in the interest of simplicity.

Networks similar to that designated 394 are intended to monitor voltage only, and in particular, voltages with respect to ground and appearing at single points at various loads in the vehicle's electrical system, and in the vehicle wiring harness.

Network 394 is associated with the window 62. Either a red or green light-emitting diode would be visible behind the window, depending on which light-emitting diode 396 or 398 was energized. The other windows 64-80 would similarly show either red or green illumination, and have appropriate identifying information corresponding to whichever of the above listed parameters was selected for monitoring.

Since such networks can be connected continuously, there is eliminated the need for service personnel touching a probe to insulated terminals while reading meters or digital indicators. One can readily appreciate the potential difficulty in using prior diagnostic systems, where such personnel had to manipulate a probe so as to engage one of a multitude of test jacks on a matrix board and simultaneously view a meter reading.

The disclosed test module has a number of important advantages. It can be permanently installed in a vehicle and thereafter, tests performed either in the service garage or on the road. Since all readings involve a mere observation of three light-emitting devices per system, at most, the analysis and trouble-shooting procedure is greatly simplified, and the likelihood of service personnel having difficulty in understanding and using the module is significantly reduced.

The use of incandescent lamps constitutes a simple solution to the problem of employing an in-line test apparatus, especially one which does not interfere with proper operation of the ECM or the various loads, and does not materially affect the interaction between the ECM and its loads, or the ECM and its connections to the +12 volt supply and +12 volt ignition lead.

More important, if a short-circuit condition or over-voltage condition occurs at a load, the series lamps act as "buffers"; as they experience higher voltages their resistances increase, and they thus provide automatic current limiting. This feature is considered of extreme importance, since it can often prevent permanent damage to an existing ECM. In the absence of such protection, damaged ECM units would have to be discarded.

A great deal of information is made available. In particular, problems with the ECM itself can be diagnosed. Also, the integrity of the electrical fittings, the vehicle wiring harness, and the connections to the loads is determined. Defective load components (relays or solenoids) are also readily pinpointed.

The module is largely self-diagnostic. The only components of the module which might be susceptible of failure are the incandescent lamps. Such a failure will in most cases be immediately apparent to the service personnel.

Finally it is believed that the present test module is among the least complex in the field, and accordingly the least expensive to manufacture and produce. While a single unit is not universal, or useable with all vehicles, it can be appreciated that the adaptation to other vehicle types can be accomplished by relatively simple wiring changes to the module's electrical input and output fittings, and perhaps a substitution in the panel comprising the windows. In this connection such windows can take the form of a transparent sheet having the light-emitting devices disposed on a printed circuit board lying immediately beneath it, with suitable plastic overlays containing the window outlines and printed legends thereon.

The incandescent lamps employed in all of the networks except those designated 168, 170, 214, 230 and 244, can be type "#259", manufactured by General Electric, Chicago Miniature Lamp Works, and others. It has a voltage rating of 6.3 volts at 250 mA. The d.c. resistance of the lamp filament when cold, is 3 ohms. When the lamp is fully illuminated, its resistance is 25 ohms.

The networks 168, 170, 214, 230 and 244 employ a different lamp, which can be type "#921", also manufactured by the companies listed above. The "#921" lamp has a rating of 12.8 volts at 1.4 amperes. The resistance of the filament, when cold, is 1.3 ohms. When the lamp is fully illuminated, the resistance is 9 ohms.

The light-emitting diodes are not critical as to type. The series resistor employed with each of the light-emitting diodes is typically 330 ohms.

The voltage regulator 94 is a type 7805, whereas regulator 96 is a type 7808. Various by-pass and filter capacitors are normally employed with these regulators, but these components have not been shown in the schematic diagram, for simplicity.

The diagnostic test module of the present invention is thus seen to represent a distinct advance and improvement in the field of diagnostic test equipment for automotive vehicles.

APPENDIX

| VEHICLE OPERATING MODE: | RED: | CLEAR: | GREEN: | FAULT? | DIAGNOSTIC CONDITION: |
|---|---|---|---|---|---|
| 1. Fuel pump relay: | | | | | |
| Key "on" | 0 | 1 | 1 | | Condition prevails for approximately 2 seconds - normal state |
|  | 1 | 0 | 0 | | Condition prevails after 2 seconds, engine not cranking or running |
| Engine | 0 | 1 | 1 | | Normal state |
| "run" | 0 | 0 | 1 | X | Windings of relay open-circuited, or ground circuit to relay interrupted |
|  | 1 | (1) | 1 | X | Relay or harness short-circuited to ground |
|  | 1 | 0 | 0 | X | No voltage output from ECM driver, or driver short-circuited to ground |
|  | 1 | 0 | 1 | X | Faulty clear lamp |
|  | 0 | 0 | 0 | X | No output from ECM and no relay in circuit |

0 indicates lamp or light-emitting diode is off.
1 indicates lamp or light-emitting diode is on.
(1) indicates bright condition of incandescent (clear) lamp.
[1] indicates dim condition of incandescent (clear) lamp.
"X" indicates a fault condition likely exists; possible nature of fault condition is indicated in the last column.

| VEHICLE OPERATING MODE: | RED: | CLEAR: | GREEN: | FAULT? | DIAGNOSTIC CONDITION: |
|---|---|---|---|---|---|
| 2. Fan control relay: | | | | | |
| Key "on" | 0 | 0 | 1 | | Normal condition |
|  | 1 | 1 | 0 | X | Faulty ECM output driver - short-circuited to ground |
|  | 1 | 0 | 0 | X | Harness short-circuited to ground |
|  | 0 | 0 | 0 | X | Relay or wiring harness open-circuited |
| Engine | 1 | 1 | 0 | | Normal condition - coolant temperature higher than 230° F. |
| "run" | 1 | 0 | 0 | X | Harness, relay open-circuited or no voltage from ignition |
|  | 1 | 0 | 1 | X | Faulty clear lamp |

0 indicates lamp or light-emitting diode is off.
1 indicates lamp or light-emitting diode is on.
(1) indicates bright condition of incandescent (clear) lamp.
[1] indicates dim condition of incandescent (clear) lamp.
"X" indicates a fault condition likely exists; possible nature of fault condition is indicated in the last column.

| VEHICLE OPERATING MODE: | RED: | CLEAR: | GREEN: | FAULT? | DIAGNOSTIC CONDITION: |
|---|---|---|---|---|---|
| 3. Canister purge solenoid: | | | | | |
| Key "on" | 1 | 1 | 0 | | Normal state |
|  | 0 | 0 | 1 | X | Faulty ECM driver, open-circuited |
|  | 1 | 0 | 0 | X | Solenoid or harness open-circuited, or no voltage from supply side |
|  | 1 | 1 | 1 | X | Solenoid short-circuited |
| Engine | 0 | 0 | 1 | | Normal state, after approximately 1 minute |
| "run" | 1 | 0 | 0 | X | Harness short-circuited to ground on load side, or faulty ECM driver |
|  | 1 | 1 | 0 | X | Faulty ECM driver |
|  | 0 | 0 | 1 | X | Solenoid short-circuited |
|  | 1 | 0 | 1 | X | Faulty clear lamp |

0 indicates lamp or light-emitting diode is off.
1 indicates lamp or light-emitting diode is on.
(1) indicates bright condition of incandescent (clear) lamp.
[1] indicates dim condition of incandescent (clear) lamp.
"X" indicates a fault condition likely exists; possible nature of fault condition is indicated in the last column.

| VEHICLE OPERATING MODE: | RED: | CLEAR: | GREEN: | FAULT? | DIAGNOSTIC CONDITION: |
|---|---|---|---|---|---|
| 4. Exhaust Gas Recirculation: | | | | | |
| Key "on" | 0 | 0 | 1 | | Normal state |
|  | 0 | 0 | 0 | X | Windings of solenoid, or harness is open-circuited |
|  | 1 | 1 | 0 | X | ECM driver faulty |
|  | 1 | (1) | 1 | X | Solenoid short-circuited to ground and ECM driver faulty |
| Engine | 0 | 0 | 1 | | Normal state |
| "run" | 1 | [1] | 0 | | Normal state, after solenoid is energized |

0 indicates lamp or light-emitting diode is off.
1 indicates lamp or light-emitting diode is on.
(1) indicates bright condition of incandescent (clear) lamp.
[1] indicates dim condition of incandescent (clear) lamp.
"X" indicates a fault condition likely exists; possible nature of fault condition is indicated in the last column.

| VEHICLE OPERATING MODE: | RED: | CLEAR: | GREEN: | FAULT? | DIAGNOSTIC CONDITION: |
|---|---|---|---|---|---|
| 5. Idle Air Control (IAC): | | | | | |
| Key "on" | 1 & 0 | [1] | 1 & 0 | | Normal State. Intermittent operation |

-continued
APPENDIX

|  |  |  |  |  | of lamps until reset occurs. |
|---|---|---|---|---|---|
|  | 1 & 0 | 0 | 1 & 0 | X | Faulty clear lamp, or IAC valve during reset |
| Engine "run" | 1 & 0 | [1] | 1 & 0 |  | Normal state. Intermittent operation of lamps until IAC motor stabilizes at idle |
|  | 1 & 0 | 0 | 1 & 0 | X | Faulty clear lamp or IAC valve at engine idle |
|  | 1 & 0 | 0 | 0 | X | Faulty IAC valve |
|  | 0 | 0 | 1 & 0 | X | Faulty ECM output |

0 indicates lamp or light-emitting diode is off.
1 indicates lamp or light-emitting diode is on.
(1) indicates bright condition of incandescent (clear) lamp.
[1] indicates dim condition of incandescent (clear) lamp.
"X" indicates a fault condition likely exists; possible nature of fault condition is indicated in the last column.

6. +12 V Battery:

| Key "on" | 0 | 0 | 1 |  | Normal state |
|---|---|---|---|---|---|
|  | 0 | 1 | 1 | X | Current limiting resistor in ECM low in ohmic value |
|  | 1 | (1) | 1 | X | Short-circuit to ground in ECM |
|  | 0 | 0 | 0 | X | Open-circuit battery harness or fusible link |

0 indicates lamp or light-emitting diode is off.
1 indicates lamp or light-emitting diode is on.
(1) indicates bright condition of incandescent (clear) lamp.
[1] indicates dim condition of incandescent (clear) lamp.
"X" indicates a fault condition likely exists; possible nature of fault condition is indicated in the last column.

7. +12 V ignition:

| Key "on" | 0 | 0 | 1 |  | Normal state |
|---|---|---|---|---|---|
|  | 0 | 0 | 0 | X | No voltage from ignition switch |
|  | 0 | 1 | 1 | X | Current limiting resistor in ECM low in ohmic value |
|  | 1 | (1) | 1 | X | Short-circuit to ground in ECM |

0 indicates lamp or light-emitting diode is off.
1 indicates lamp or light-emitting diode is on.
(1) indicates bright condition of incandescent (clear) lamp.
[1] indicates dim condition of incandescent (clear) lamp.
"X" indicates a fault condition likely exists; possible nature of fault condition is indicated in the last column.

8. Injectors (Fuel injector solenoids):

| Key "on" | 0 | 0 | 1 |  | Normal state |
|---|---|---|---|---|---|
|  | 0 | 0 | 0 | X | Harness open-circuited, no voltage to solenoids |
|  | 1 | 1 | 0 | X | Faulty ECM driver |
|  | 1 | (1) | 0 | X | Short-circuited solenoid and ECM driver |
| Engine "run" | 1 & 0 | 1 & 0 | 1 & 0 |  | Normal state. Intermittent operation of lamps due to rpm of engine |
|  | 1 & 0 | 0 | 1 & 0 | X | High winding resistance for solenoids |
|  | 1 & 0 | (1) & 0 | 1 | X | Short-circuited solenoid |
|  | 1 & 0 | 0 | 1 | X | Faulty clear lamp |

0 indicates lamp or light-emitting diode is off.
1 indicates lamp or light-emitting diode is on.
(1) indicates bright condition of incandescent (clear) lamp.
[1] indicates dim condition of incandescent (clear) lamp.
"X" indicates a fault condition likely exists; possible nature of fault condition is indicated in the last column.

9. Check engine lamp:

| Key "on" | 1 | 1 | 0 |  | Normal state |
|---|---|---|---|---|---|
|  | 1 | 0 | 0 | X | Faulty "Check Engine" lamp, or harness open-circuited |
|  | 0 | 0 | 1 | X | Faulty ECM driver |
|  | 1 | (1) | 1 | X | Short to 12 volts in lamp circuit |
|  | 1 | 0 | 1 | X | Faulty clear lamp |
| Engine "run" | 0 | 0 | 1 |  | Normal state |

0 indicates lamp or light-emitting diode is off.
1 indicates lamp or light-emitting diode is on.
(1) indicates bright condition of incandescent (clear) lamp.
[1] indicates dim condition of incandescent (clear) lamp.
"X" indicates a fault condition likely exists; possible nature of fault condition is indicated in the last column.

10. A/C relay:

| Key "on" | 0 | 0 | 1 |  | Normal state (A/C switch Off) |
|---|---|---|---|---|---|
|  | 1 | 1 | 0 | X | ECM driver short-circuited to ground |
|  | 1 | 0 | 0 | X | Short-circuit in harness |
|  | 0 | 0 | 0 | X | Relay open-circuited, or loss of voltage to relay circuit |
| Engine | 1 | 1 | 0 |  | Normal state (A/C switch On) |

-continued

APPENDIX

| | | | | | |
|---|---|---|---|---|---|
| "run" | 1 | 0 | 0 | X | Relay open-circuited, or loss of voltage to relay circuit; A/C fuse blown |
| | 1 | 0 | 1 | X | Faulty clear lamp |

0 indicates lamp or light-emitting diode is off.
1 indicates lamp or light-emitting diode is on.
(1) indicates bright condition of incandescent (clear) lamp.
[1] indicates dim condition of incandescent (clear) lamp.
"X" indicates a fault condition likely exists; possible nature of fault condition is indicated in the last column.

11. Air Switch Solenoid:

| | | | | | |
|---|---|---|---|---|---|
| Key "on" | 0 | 0 | 1 | | Normal state |
| | 1 | 1 | 0 | X | Faulty ECM driver |
| | 1 | 0 | 1 | X | Faulty clear lamp |
| | 0 | 0 | 0 | X | Solenoid or harness open-circuited to 12 volt ignition |
| | 1 | (1) | 1 | X | Solenoid short-circuited out of circuit |
| Engine | 0 | 0 | 1 | | Normal state |
| "run" | 1 | 1 | 0 | | Normal state - road test |

0 indicates lamp or light-emitting diode is off.
1 indicates lamp or light-emitting diode is on.
(1) indicates bright condition of incandescent (clear) lamp.
[1] indicates dim condition of incandescent (clear) lamp.
"X" indicates a fault condition likely exists; possible nature of fault condition is indicated in the last column.

12. Air control solenoid:

| | | | | | |
|---|---|---|---|---|---|
| Key "on" | 1 | 1 | 0 | | Normal state |
| | 0 | 0 | 1 | X | Faulty ECM driver |
| | 1 | 0 | 1 | X | Faulty clear lamp |
| | 0 | 0 | 0 | X | Solenoid or harness open-circuited to 12 volt ignition |
| | 1 | (1) | 1 | X | Solenoid shorted out of circuit |
| Engine | 1 | 1 | 0 | | Normal state |
| "run" | 0 | 0 | 1 | | Normal state - road test |

0 indicates lamp or light-emitting diode is off.
1 indicates lamp or light-emitting diode is on.
(1) indicates bright condition of incandescent (clear) lamp.
[1] indicates dim condition of incandescent (clear) lamp.
"X" indicates a fault condition likely exists; possible nature of fault condition is indicated in the last column.

13. MAF (Mass Air Flow Relay Control):

| | | | | | |
|---|---|---|---|---|---|
| Key "on" | 0 | 0 | 1 | | Normal state |
| | 1 | 1 | 0 | X | Faulty ECM driver |
| | 1 | 0 | 1 | X | Faulty clear lamp |
| | 0 | 0 | 0 | X | Relay coil or harness open-circuited to 12 volt ignition |
| | 1 | (1) | 1 | X | Relay coil short-circuited out of circuit |
| Engine | 0 | 0 | 1 | | Normal state |
| "run" | 1 | 1 | 0 | | Normal state - road test |

0 indicates lamp or light-emitting diode is off.
1 indicates lamp or light-emitting diode is on.
(1) indicates bright condition of incandescent (clear) lamp.
[1] indicates dim condition of incandescent (clear) lamp.
"X" indicates a fault condition likely exists; possible nature of fault condition is indicated in the last column.

| VEHICLE OPERATING MODE: | RED: | CLEAR #1: | CLEAR #2*: | GREEN: | FAULT? | DIAGNOSTIC CONDITION: |
|---|---|---|---|---|---|---|
| 14. Transmission Converter Clutch (automatic transmission equipped vehicles, only): | | | | | | |
| Key "on" | 0 | 0 | 0 | 1 | | Normal state |
| | 0 | 0 | 0 | 0 | X | No voltage from test button circuit |
| | 1 | ·1 | 1 | 0 | X | Faulty ECM driver, short-circuited |
| | 0 | 0 | 0 | 1 | X | Faulty ECM driver, open-circuited |
| | 1 | 0 | 0 | 1 | X | Faulty clear lamp |
| Engine | 1 | 1 | — | 0 | | Normal state - road test |
| "run" | 1 | 0 | — | 0 | X | Faulty solenoid, or harness open-circuited |
| | 1 | (1) | — | 1 | X | Faulty solenoid, or harness short-circuited to +12 volts |

*Readings of clear #2 lamp are made with test switch 390, FIG. 5, closed.
Clear #2 refers to incandescent lamp 392 in FIG. 5. Clear #1 refers to incandescent lamp 384 in FIG. 5.
0 indicates lamp or light-emitting diode is off.
1 indicates lamp or light-emitting diode is on.

APPENDIX -continued (1) indicates bright condition of incandescent (clear) lamp.
[1] indicates dim condition of incandescent (clear) lamp.
"X" indicates a fault condition likely exists; possible nature of fault condition is indicated in the last column.

| VEHICLE OPERATING MODE: | RED: | GREEN: | FAULT? | DIAGNOSTIC CONDITION: |
|---|---|---|---|---|
| 15. FUEL PUMP SIGNAL: | | | | |
| Key "on" | 0 | 1 | | Normal state, for approximately 2 seconds |
| | 1 | 0 | | Normal state, for approximately 2 seconds; engine not being cranked; engine not running |
| Engine | 0 | 1 | | Normal state |
| "run" | 1 | 0 | X | Faulty pump switch |
| | 0 | 0 | X | Faulty fuel pump |

0 indicates light-emitting diode is off.
1 indicates light-emitting diode is on.
"X" indicates a fault condition likely exists; possible nature of fault condition is indicated in the last column.

What is claimed is:

1. A diagnostic test circuit for monitoring the magnitude of electrical parameters existing between an electrical driver and an electrical load comprising, in combination:
   (a) visual indicator means connected to a point adjacent the electrical driver, said indicator means providing a visual signal when the voltage at the point of connection lies within a predetermined range, with respect to electrical ground,
   (b) additional visual indicator means, separate from the first, connected to a point adjacent the electrical load, said additional indicator means providing a visual signal when the voltage at its point of connection lies within a predetermined range, with respect to electrical ground, and
   (c) a third visual indicator means, connected between said electrical driver and said electrical load, said third indicator means providing a visual signal in response to current flowing between said driver and said load,
   (d) said third visual indicator means having a positive temperature coefficient of impedance whereby it presents a relatively low electrical impedance when experiencing relatively low current flow, and a higher impedance upon experiencing increased current flow,
   (e) said first-mentioned, additional, and third visual indicator means forming a pi-network.

2. The invention as set forth in claim 1, wherein:
   (a) said legs of the pi-network comprise the first-mentioned and additional visual indicator means,
   (b) the bridge of the pi-network comprising said third visual indicator means.

* * * * *